(12) United States Patent
Jang

(10) Patent No.: US 7,592,253 B2
(45) Date of Patent: Sep. 22, 2009

(54) METHOD FOR FORMING A DAMASCENE PATTERN OF A COPPER METALLIZATION LAYER

(75) Inventor: Jeong Yel Jang, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 301 days.

(21) Appl. No.: 11/644,888

(22) Filed: Dec. 26, 2006

(65) Prior Publication Data

US 2007/0155170 A1    Jul. 5, 2007

(30) Foreign Application Priority Data

Dec. 29, 2005    (KR) .................. 10-2005-0134234

(51) Int. Cl.
*H01L 21/4763*    (2006.01)

(52) U.S. Cl. ................... 438/637; 438/638; 438/672

(58) Field of Classification Search .......... 438/622, 438/625, 627, 637, 638, 639, 671, 672
See application file for complete search history.

(56) References Cited

U.S. PATENT DOCUMENTS

| 6,429,119 | B1 * | 8/2002 | Chao et al. | 438/633 |
| 6,479,391 | B2 * | 11/2002 | Morrow et al. | 438/706 |
| 6,573,176 | B2 * | 6/2003 | Hong | 438/637 |
| 2004/0087166 | A1 * | 5/2004 | Morrow | 438/694 |
| 2004/0092093 | A1 * | 5/2004 | Schwarzl et al. | 438/624 |
| 2005/0085064 | A1 * | 4/2005 | Cooney et al. | 438/622 |
| 2006/0134921 | A1 * | 6/2006 | Wu et al. | 438/710 |

* cited by examiner

*Primary Examiner*—Kevin M Picardat
(74) *Attorney, Agent, or Firm*—Finnegan, Henderson, Farabow, Garrett & Dunner, L.L.P.

(57) ABSTRACT

There is provided a method of forming a damascene pattern including a via and a trench in a damascene process of forming a copper metal interconnection. The method includes forming an interlayer dielectric layer on a substrate, forming a first photosensitive layer pattern including a first opening that exposes a region in which a via is to be formed on the interlayer dielectric layer, etching the interlayer dielectric layer to a first depth using the first photosensitive layer pattern as an etching mask, removing the first photosensitive layer pattern and forming a second photosensitive layer pattern including a second opening that exposes a region in which a trench is to be formed on the interlayer dielectric layer, and etching the interlayer dielectric layer using the second photosensitive layer pattern as an etching mask to simultaneously form the via and the trench.

4 Claims, 5 Drawing Sheets

METHOD FOR FORMING A DAMASCENE PATTERN OF A COPPER METALLIZATION LAYER

RELATED APPLICATION

This application is based upon and claims the benefit of priority to Korean Application No. 10-2005-0134234, filed on Dec. 29, 2005, the entire contents of which are incorporated herein by reference.

BACKGROUND

1. Technical Field

The present invention relates to a method of manufacturing a semiconductor device. More specifically, the present invention relates to a method of forming a copper metal interconnection of a semiconductor device using a damascene process.

2. Description of the Related Art

In a semiconductor manufacturing process a front end of the line (FEOL) process may involve forming a transistor on a silicon substrate, whereas a back end of the line (BEOL) process may involve forming metal interconnections. The interconnection technology refers to a process of electrically connecting transistors to each other in order to realize power supply and signal transmission paths that constitute an integrated circuit on a silicon substrate.

In such interconnection technology, copper (Cu), having high electro-migration (EM) is widely used.

However, since copper (Cu) is not easily etched but is oxidized during the process, a copper metal interconnection is formed through a dual damascene process unlike a common metal process.

In particular, in the dual damascene process, after forming a via and a trench in an interlayer dielectric layer, copper is buried in a via or a trench using an electro-chemical plating (ECP) method and planarization is performed by a chemical mechanical polishing (CMP) process to form a copper interconnection.

Furthermore, in the dual damascene process, a damascene pattern including the via and the trench are formed in the interlayer dielectric layer.

Since it is possible to reduce a step difference between metal interconnections by the dual damascene process, it is possible to easily perform sequential processes.

A conventional method for forming the damascene pattern consists of a method of forming a via followed by a method of forming a trench or vice versa.

No matter which method is used, various steps involving photolithography and etching processes which must be performed, increases in comparison with a common metal interconnection process.

The most widely used method is the method of first forming the via. Referring to FIGS. 1A to 1E, a conventional damascene pattern forming method will be briefly described.

Referring to FIG. 1A, a barrier insulating layer 11 and an interlayer dielectric layer 12 are sequentially deposited on a substrate 10 or a lower metal interconnection (not shown). As illustrated in FIG. 1B, a via hole 14 is formed in inter layer dielectric layer 12 using a photolithography process and an etching process. Barrier insulating layer 11 under interlayer dielectric layer 12 is used as an etch stop layer.

As illustrated in FIG. 1C, after applying an anti-reflective material 14a on the entire surface of interlayer dielectric layer 12, anti-reflective material 14a formed on interlayer dielectric layer 12 is removed with anti-reflective material 14a left only in via hole 14. As illustrated in FIG. 1D, a trench 15 is formed in interlayer dielectric layer 12 using a photolithography process and a etching process. While interlayer dielectric layer 12 is etched, a part of anti-reflective material 14a formed in via hole 14 is removed.

Illustrated in FIG. 1E, anti-reflective material (14a of FIG. 1D) that resides in via hole 14 is removed and a part of barrier insulating layer 11 exposed by via hole 14 is removed. The barrier metal layer is deposited on the entire surface of the resultant material and the copper is buried in via hole 14 and trench 15 using an ECP method. Finally, planarization is performed to the surface of the interlayer dielectric layer using the CMP process to complete the copper metal interconnection.

In the above-described dual damascene process, the method of first forming the via hole, and then forming the trench is performed. The anti-reflective material is buried in the via hole and a trench etching process is performed. The buried anti-reflective material is removed through an ashing process. However, a by-product can be formed in the trench etching process in accordance with etching selectivity with respect to the anti-reflective material. As illustrated in FIG. 1D, the by-product generated by the trench etching process forms a fence 14b on the via hole. Thus fence 14b resides without being removed in the sequential ashing process. When fence 14b is not completely removed, the barrier metal layer formed in order to prevent the copper from being diffused is not uniformly deposited around the via hole. Therefore, in the region where fence 14b is formed, the diffusion path of the copper can be formed. Also, due to fence 14b, defects such as voids may be caused in the copper interconnection formed by an ECP method.

BRIEF SUMMARY

Consistent with the present invention there is provided a method of forming a damascene pattern capable of preventing the performance of a device from being reduced due to defect such as a fence in a dual damascene process.

In addition, consistent with the present invention there is provided a method of forming a damascene pattern of a copper metal interconnection in which the number of processes is significantly reduced to improve productivity.

Consistent with the present invention there is provided a method of forming a damascene capable of minutely forming the line width of a metal interconnection.

There is provided a method of forming a damascene pattern including a via and a trench in a damascene process of forming a copper metal interconnection. The method includes forming an interlayer dielectric layer on a substrate, forming a first photosensitive layer pattern including a first opening that exposes a region in which a via is to be formed on the interlayer dielectric layer, etching the interlayer dielectric layer to a first depth using the first photosensitive layer pattern as an etching mask, removing the first photosensitive layer pattern and forming a second photosensitive layer pattern including a second opening that exposes a region in which a trench is to be formed on the interlayer dielectric layer, and etching the interlayer dielectric layer using the second photosensitive layer pattern as an etching mask to simultaneously form the via and the trench.

The first depth is no less than 50% and no more than 80% of the thickness of the interlayer dielectric layer. A barrier insulating layer interposed between the substrate and the interlayer dielectric layer is further comprised and the interlayer dielectric layer and the barrier insulating layer are sequentially etched. The first depth is no less than 50% and no more than 80% of the total thickness of the interlayer dielectric layer and the barrier insulating layer. The step of forming plasma reaction by-product layers are formed on both layers that face each other of the second photosensitive pattern. The second photosensitive layer pattern and the reaction by-product layers are used as etching masks.

DETAILED DESCRIPTION

Hereinafter, preferred embodiments of a method of forming a damascene pattern consistent with the present invention will be described with reference to FIGS. 2A to 2E.

Figure 1A:
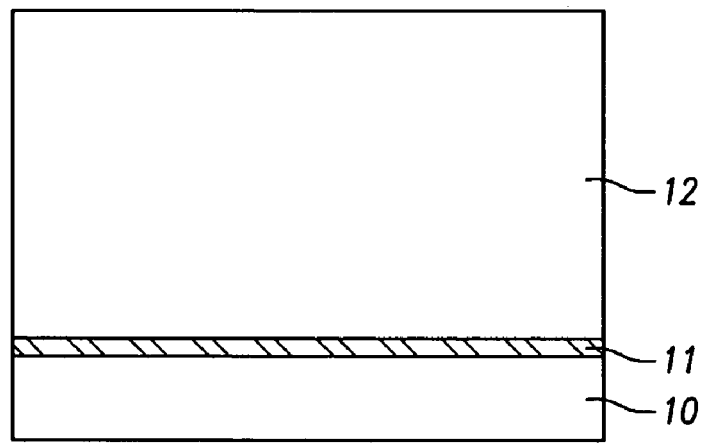
FIGS. 1A to 1E illustrate a method of forming a damascene pattern including a via and a trench in an interlayer dielectric layer in a conventional dual damascene process.
Figure 1B:
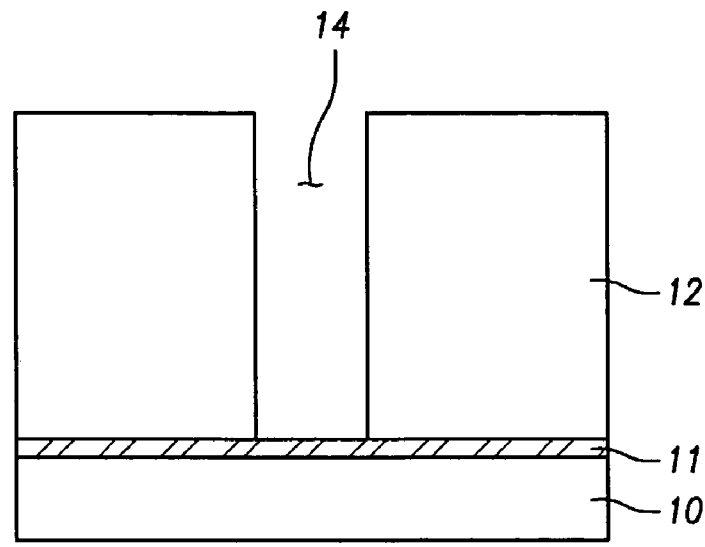
Figure 1C:
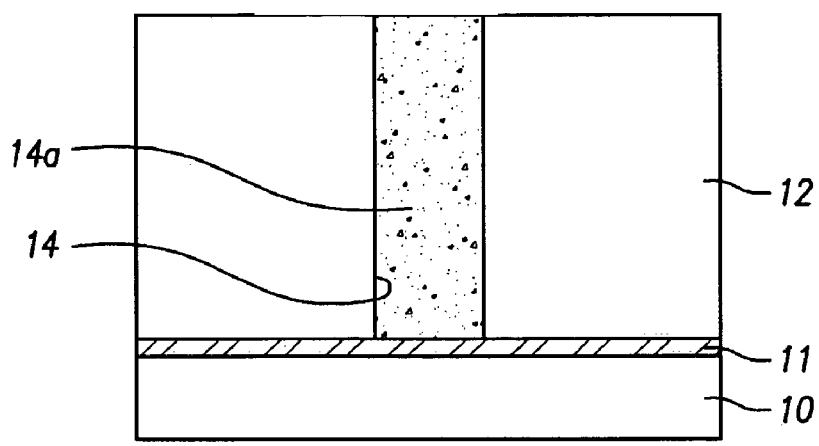
Figure 1D:
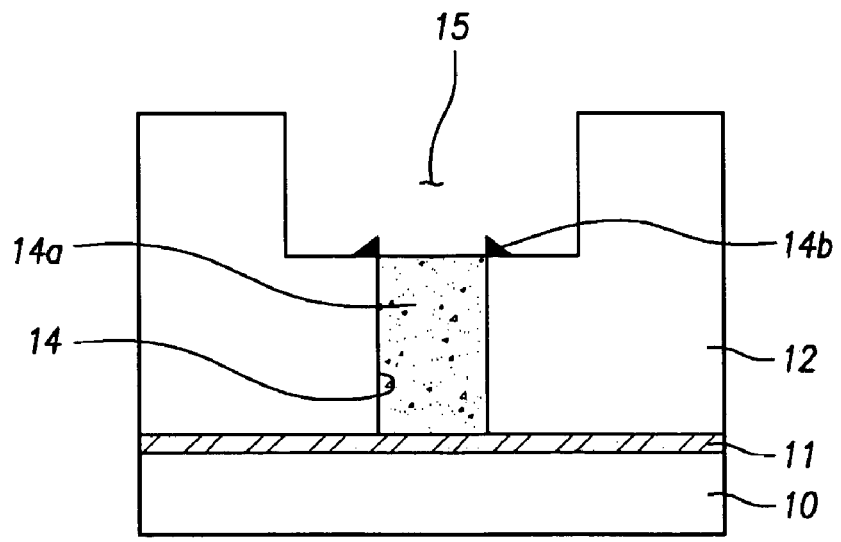
Figure 1E:
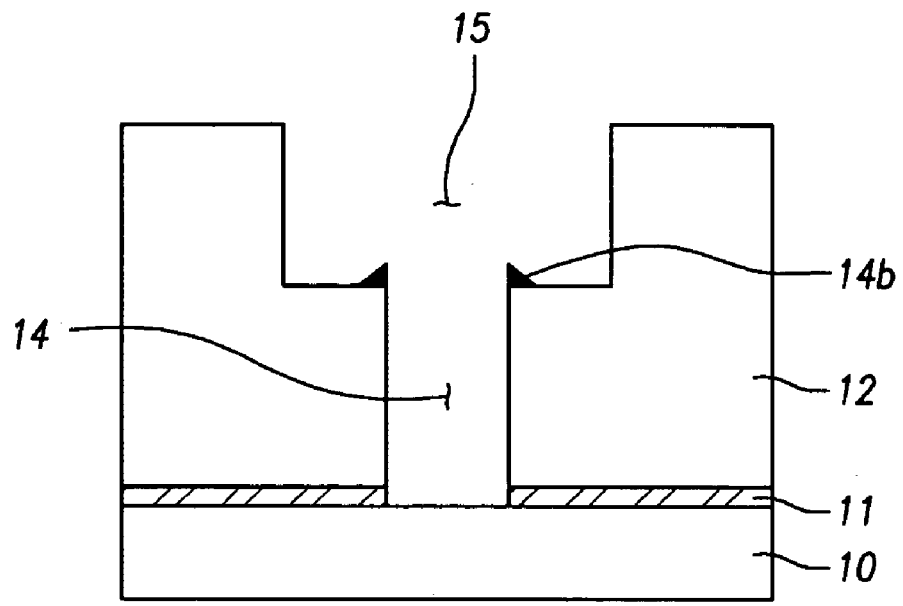
Figure 2A:
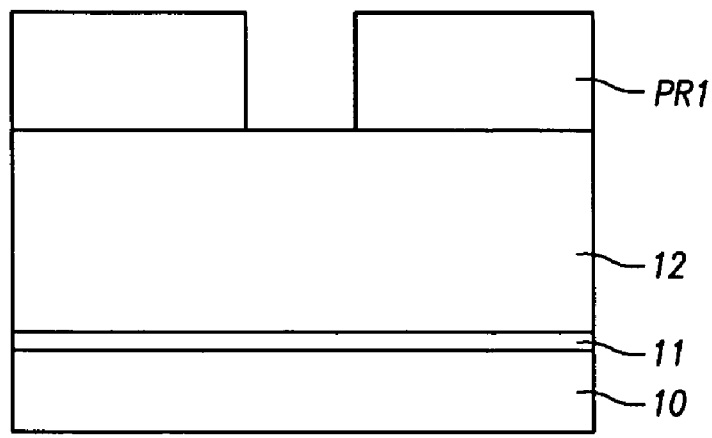
FIGS. 2A to 2E illustrate a method of forming a damascene pattern according consistent with the present invention.

Referring to FIG. 2A, a barrier insulating layer 11 and an interlayer dielectric layer 12 are sequentially formed on a substrate 10 or a lower metal interconnection (not shown). Here, a low dielectric constant material such as fluorinated silicate glass (FSG), coral, and black diamond is used as interlayer dielectric layer 12. Also, a silicon nitride layer may be used as barrier insulating layer 11.

A capping insulating layer such as $SiH_4$ may be further formed on interlayer dielectric layer 12. After forming interlayer dielectric layer 12, a first photosensitive layer pattern PR1 is formed on interlayer dielectric layer 12. First photosensitive layer pattern PR1 has an opening that limits a region in which a via is to be formed.

Figure 2B:
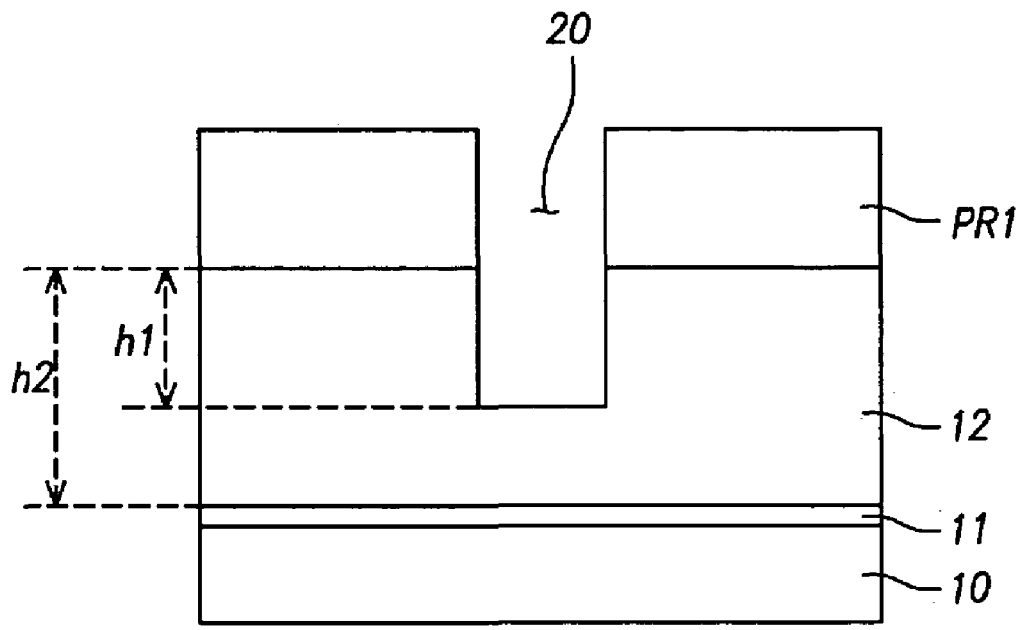

As illustrated in FIG. 2B, the exposed part of interlayer dielectric layer 12 is etched using first photosensitive layer pattern PR1 as an etching mask.

Interlayer dielectric layer 12 is not completely etched but a hole 20 is formed to have a predetermined depth. Hole 20 is preferably formed to have a height or a depth (h1) corresponding to about 50% to 80% of thickness (h2) of interlayer dielectric layer 12.

When barrier insulating layer 11 is formed, hole 20 is preferably formed with the depth corresponding to 50% to 80% with respect to the total thickness of interlayer dielectric layer 12 and barrier insulating layer 11.

Figure 2C:
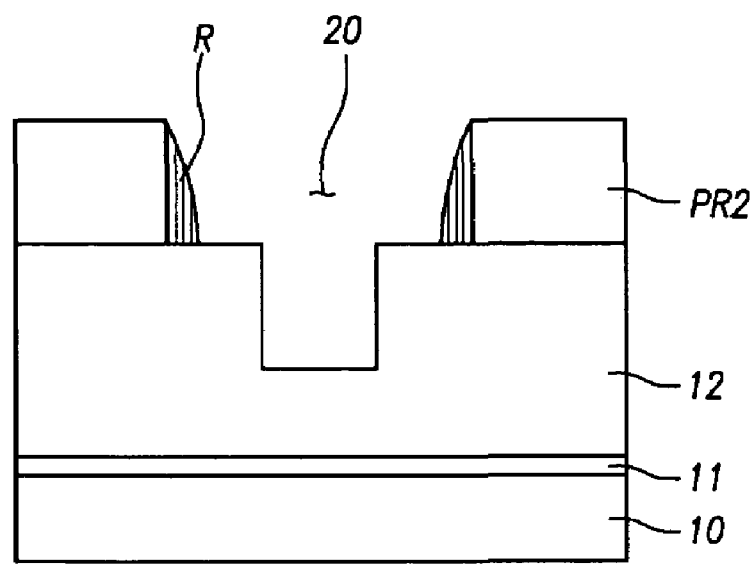

As illustrated in FIG. 2C, first photosensitive layer pattern PR1 is removed and a second photosensitive layer pattern PR2 is formed on interlayer dielectric layer 12.

Second photosensitive layer pattern PR2 has an opening that exposes a region in which the trench is to be formed including the region in which hole 20 is formed.

Additionally, a plasma process is performed on both side walls that face each other on the second photosensitive layer pattern PR2 to form spacers R formed by a reaction by-product between a photosensitive agent and plasma.

Spacers R that are reaction by-product layers can be formed by properly changing a process condition of the plasma process preferably before the sequential trench etching process.

When the reaction by-product is attached to the side walls of the photosensitive layer pattern, the size of the opening is reduced.

Recently, as integration of semiconductor devices increase, it is necessary to form metal interconnections of a minute line width. Since it is possible to minutely form the copper metal interconnection using the reaction by-product, it is not necessary to use high price exposure equipment such as an ArF excimer laser.

Figure 2D:
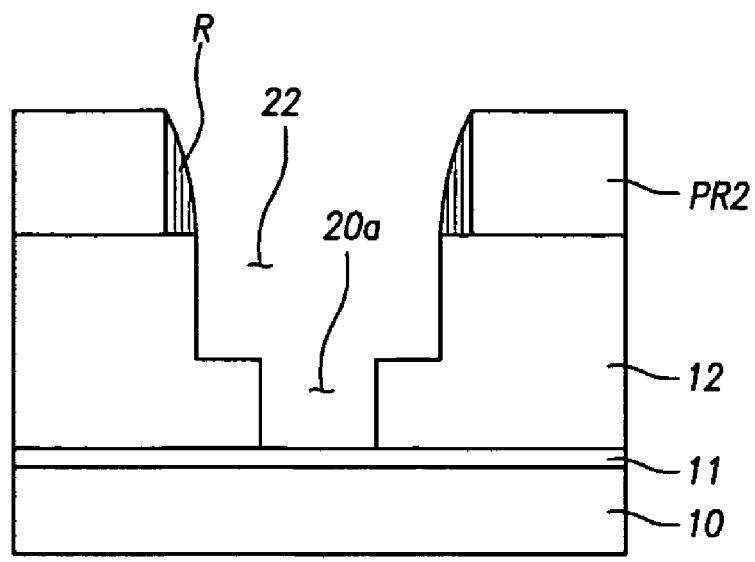

Referring to FIG. 2D, interlayer dielectric layer 12 is etched using second photosensitive layer pattern PR2 and the reaction by-product spacers R as etching masks to form a trench.

At this time, the region in which the via is to be formed can be removed during the etching of the trench.

That is, hole 20 is formed in interlayer insulating layer 12 only with a predetermined depth and interlayer insulating layer 12 is not completely penetrated by hole 20. Since the region in which the via is to be formed can be etched during the etching process of FIG. 2D, trench 22 and via 20a can be simultaneously formed by performing the etching process once.

Figure 2E:
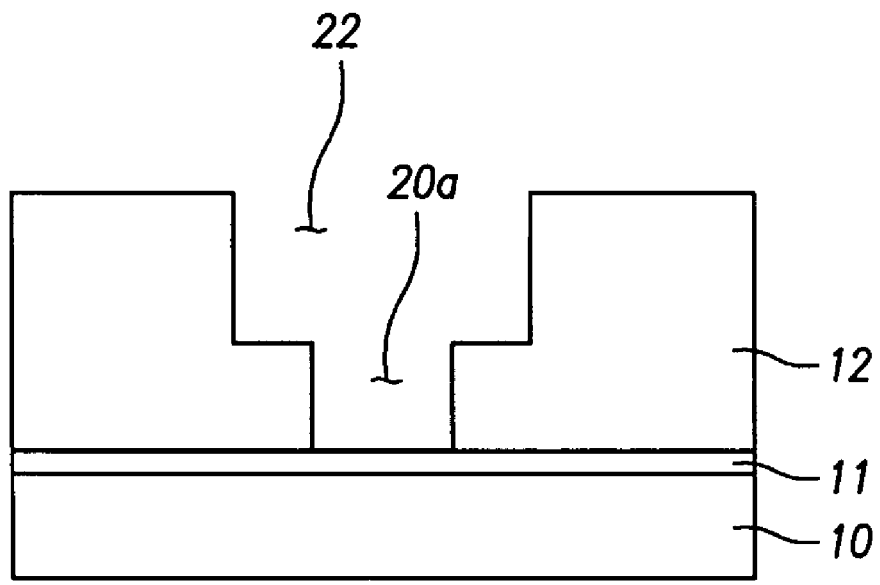

As a result, the damascene pattern illustrated in FIG. 2E can be formed.

After forming the damascene pattern and after second photosensitive layer pattern PR2 is removed and the substrate is cleansed, a sequential damascene process is performed. In this process, the barrier metal layer formed of tantalium/tantalium nitride layer is deposited on the entire surface of the resultant structure and a copper plating layer is buried in via hole 20a and trench 22 using the ECP method. For the plating of the copper, a copper seed layer can be formed on the barrier metal layer. A CMP process is used to remove the copper plating layer to the surface of interlayer dielectric layer 12 and to thus complete the copper metal interconnection.

Consistent with the present invention, it is possible to omit the processes of burying the anti-reflective material in the via hole and of removing the same. Therefore, a defect such as the fence is not generated due to the residual of the anti-reflective material so that it is possible to form a metal interconnection with improved reliability. Also, since the via hole and the trench can be simultaneously formed by performing the etching process once, the number of processes is significantly reduced. In particular, it is possible to form the trench to no more than 100 nm without using high priced exposure equipment.

It will be apparent to those skilled in the art that various changes in modifications may be made without departing from the spirit and scope consistent with the invention as defined by the appended claims.

The invention claimed is:

1. A method of forming a damascene pattern including a via and a trench in a damascene process of forming a copper metal interconnection, comprising:
    forming an interlayer dielectric layer on a substrate;
    forming a first photosensitive layer pattern including a first opening that exposes a region in which a via is to be formed on the interlayer dielectric layer;
    etching the interlayer dielectric layer to a first depth using the first photosensitive layer pattern as an etching mask;
    removing the first photosensitive layer pattern and forming a second photosensitive layer pattern including a second opening that exposes a region in which a trench is to be formed on the interlayer dielectric layer;
    forming plasma reaction by-product layers on sidewalls of the second photosensitive pattern in the second opening; and etching the interlayer dielectric layer using the second photosensitive layer pattern and the plasma reaction by-product layers as an etching mask to simultaneously form the via and the trench.

2. The method according to claim 1, wherein the first depth is no less than 50% and no more than 80% of a thickness of the interlayer dielectric layer.

3. The method according to claim 1, wherein forming the interlayer dielectric layer comprises forming a barrier insulating layer between the substrate and the interlayer dielectric layer; and etching the interlayer dielectric layer further comprises sequentially etching the interlayer dielectric layer and the barrier insulating layer.

4. The method according to claim 3, wherein the first depth is no less than 50% and no more than 80% of the total thickness of the interlayer dielectric layer and the barrier insulating layer.

\* \* \* \* \*